United States Patent  
Wiseman et al.

US 6,825,916 B2
Nov. 30, 2004

(54) RETICLE CARRIER WITH POSITIONING COVER

(75) Inventors: Brian Wiseman, Glencoe, MN (US); Justin Strike, Maple Grove, MN (US)

(73) Assignee: Entegris, Inc., Chaska, MN (US)

( * ) Notice: Subject to any disclaimer, the term of this patent is extended or adjusted under 35 U.S.C. 154(b) by 0 days.

(21) Appl. No.: 10/190,347

(22) Filed: Jul. 5, 2002

(65) Prior Publication Data

US 2004/0004704 A1 Jan. 8, 2004

(51) Int. Cl.[7] .................. G03B 27/62; B65D 85/00; B65D 85/48
(52) U.S. Cl. ............... 355/75; 206/710; 206/454
(58) Field of Search .................. 355/75, 76; 428/14; 206/710, 454

(56) References Cited

U.S. PATENT DOCUMENTS 6,216,873 B1 * 4/2001 Fosnight et al. ............ 206/710

* cited by examiner

Primary Examiner—Peter B. Kim
(74) Attorney, Agent, or Firm—Patterson, Thuente, Skaar & Christensen, P.A.

(57) ABSTRACT

A carrier for a reticle used in photolithographic semiconductor processing, having a base portion and a cover portion. The base portion has a plurality of reticle supports and a plurality of reticle positioning members. The cover portion is adapted to sealingly mate with the base portion, and has an inner surface with a plurality of spaced apart reticle restraints and a pair of reticle positioning tabs projecting inwardly therefrom. Each reticle positioning tab has a diagonal edge portion, and is oriented so that the diagonal edge portion urges a reticle resting on the reticle supports into engagement with the reticle restraints when the cover portion is mated with the base portion.

18 Claims, 5 Drawing Sheets

RETICLE CARRIER WITH POSITIONING COVER

FIELD OF THE INVENTION

The invention relates to carriers for reticles used in photolithographic integrated circuit production, and more specifically to features for self-positioning of a reticle within a reticle carrier.

BACKGROUND OF THE INVENTION

Integrated circuit devices are commonly manufactured using a process known as photolithography. In photolithography, a photoresist layer is first deposited on a wafer substrate. Radiant energy, such as ultraviolet light, is then projected onto the photoresist layer through a template in the form of a mask or reticle having the desired pattern. The photoresist layer is then developed to remove either the exposed portions or the unexposed portions, to form a resist mask on the substrate. The resist mask can then be used to protect underlying areas during later deposition or etching processes.

An important component of the photolithographic apparatus is the reticle, which provides the pattern and layout corresponding to the various integrated circuit features. Typically, the reticle is a transparent glass plate with a layer of opaque or semi-opaque material coated thereon forming the pattern. It is critically important that the surfaces of the reticle, especially the coated surface, be protected from damage or contamination, since any such defects or contamination may be projected onto the photoresist layer during exposure, thus leading to a finished integrated circuit device of unacceptably diminished or even unusable quality.

Specialized carriers have been developed to protect a reticle from physical damage and contamination during storage and transport. These carriers typically comprise an enclosure having various reticle contact portions therein for supporting and restraining the reticle from movement. The reticle is usually manually positioned on support surfaces within the enclosure, and the reticle is then engaged and more closely restrained against movement by restraint members attached within the enclosure. These restraint members are typically designed to engage the reticle at its edges. A problem, however, has been that a person initially manually positioning the reticle on the support surfaces may fail to place the reticle in the proper position for engagement by the restraint members, or may inadvertently cause the reticle to be dislodged from its proper positioning before it is engaged by the restraint members. If the reticle is out of position a sufficient distance, the restraint members may then engage the reticle on its surfaces rather than at its edges, thereby causing scratching or other physical damage to the reticle.

What is needed is some type of structure or device for ensuring proper self positioning of a reticle within a reticle carrier to prevent damage during engagement by restraint members.

SUMMARY OF THE INVENTION

The present invention provides a means of properly positioning a reticle in a carrier for engagement by reticle restraints while minimizing the opportunities for surface damage to the reticle inflicted by the reticle restraints. Also, with the present invention, manual positioning of the reticle on the reticle supports may be less precise, allowing for a greater margin for error.

The present invention is a reticle carrier having features for self-positioning of the reticle. In a currently most preferred embodiment of the invention, the carrier has a base portion and a cover portion. The base portion has reticle supports along with positioning tabs to guide proper manual positioning of the reticle on three sides. The base portion has no positioning tabs on the fourth side of the reticle. The cover portion has downwardly projecting self-positioning tabs having diagonal edges positioned so as to be engageable with the fourth side of the reticle. These downwardly projecting self-positioning tabs are oriented so that when the cover portion is placed over the base portion and pressed downward into engagement, the diagonal edges of the self-positioning tabs will engage an upper corner on the fourth side of the reticle, if the reticle is not properly positioned. As the cover portion is moved further downward into engagement with the base portion, the reticle is urged into proper position by the diagonal edges of the self-positioning tabs.

Accordingly, the present invention may be characterized in one embodiment as a carrier for a reticle used in photolithographic semiconductor processing, having a base portion and a cover portion. The base portion has a plurality of reticle supports and a plurality of reticle positioning members. The cover portion is adapted to sealingly mate with the base portion, and has an inner surface with a plurality of spaced apart reticle restraints and a pair of reticle positioning tabs projecting inwardly therefrom. Each reticle positioning tab has a diagonal edge portion, and is oriented so that the diagonal edge portion urges a reticle resting on the reticle supports into engagement with the reticle restraints when the cover portion is mated with the base portion.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE PREFERRED EMBODIMENTS

The accompanying Figures depict embodiments of the reticle carrier of the present invention, and features and components thereof. Any references to front and back, right and left, top and bottom, upper and lower, and horizontal and vertical are intended for convenience of description, not to limit the present invention or its components to any one positional or spacial orientation. Any dimensions specified in the attached Figures and this specification may vary with a potential design and the intended use of an embodiment of the invention without departing from the scope of the invention.

In FIGS. 1–10, there is shown a preferred embodiment of the self-positioning reticle carrier 100 of the present invention. Reticle carrier 100 generally comprises an enclosure 101 formed by mating base portion 120 with cover portion 140.

Figure 1:
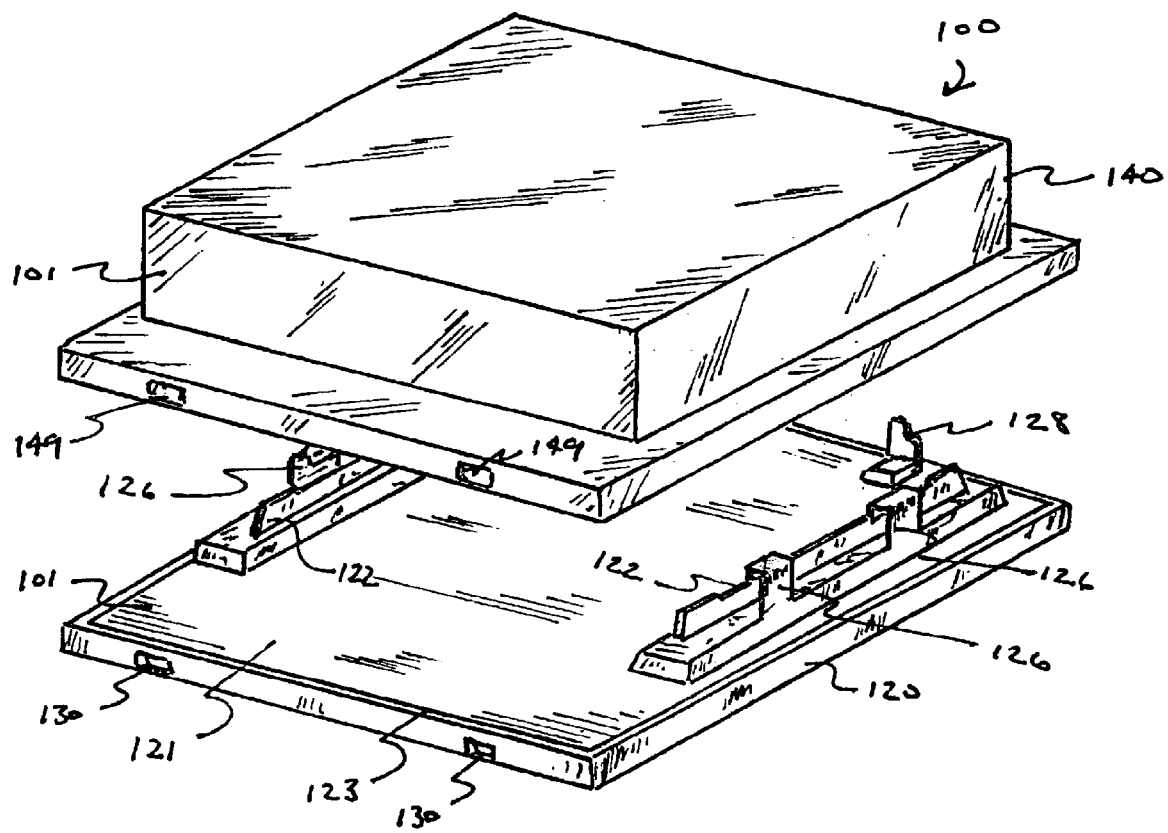
FIG. 1 is a perspective view of a reticle carrier according to a preferred embodiment of the present invention.
Figure 2:
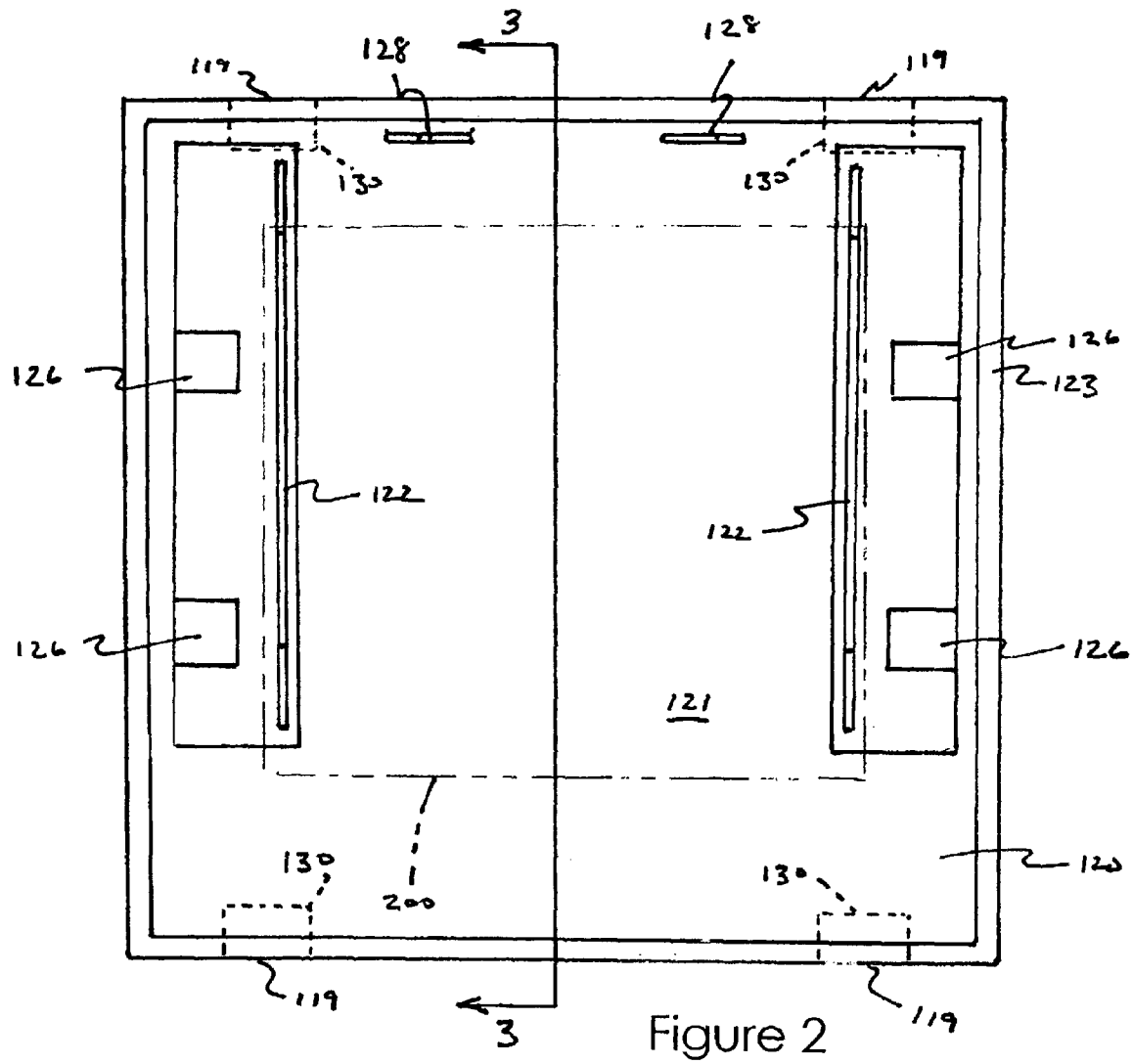
FIG. 2 is a top plan view of the base portion of the reticle carrier of FIG. 1.
Figure 3:
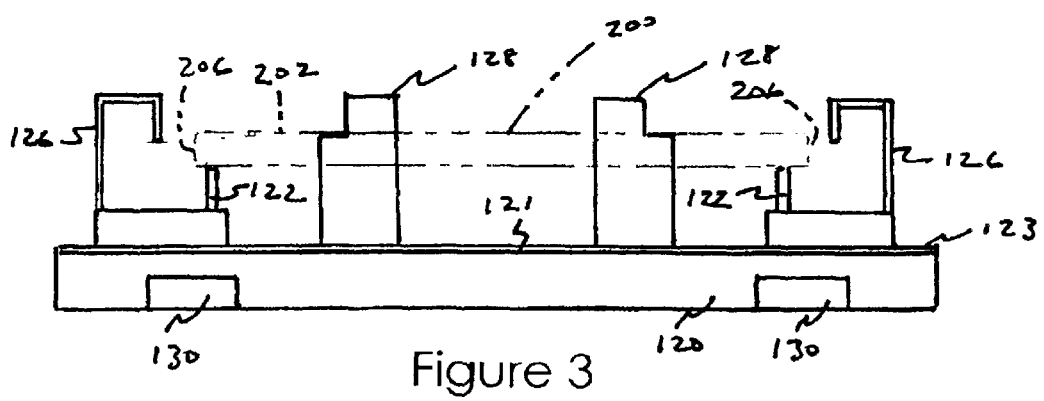
FIG. 3 is a sectional view of the base portion of the reticle carrier of FIG. 2.

Base portion 120, shown best in FIGS. 2 and 3, has reticle supports 122 projecting upwardly from planar backing portion 121. Reticle side positioning members 126 and back positioning members 128 are provided to guide manual positioning of a reticle and ensure proper lateral and rearward placement of the reticle on reticle supports 122. Gasket 123 is provided at the periphery of backing portion 121, and is positioned so as to sealingly engage mating surface 148 of cover portion 140.

Figure 4:
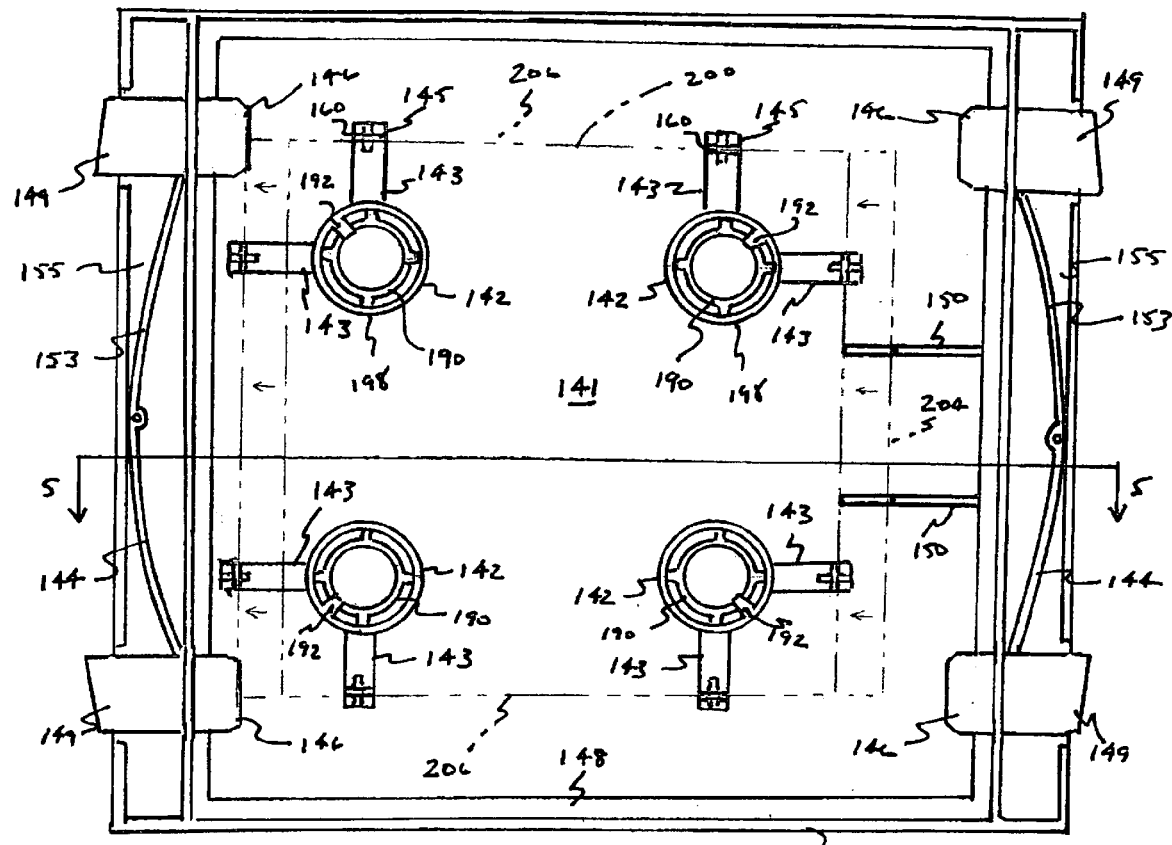
FIG. 4 is a plan view of the inside of the cover portion of the reticle carrier of FIG. 1.
Figure 5:
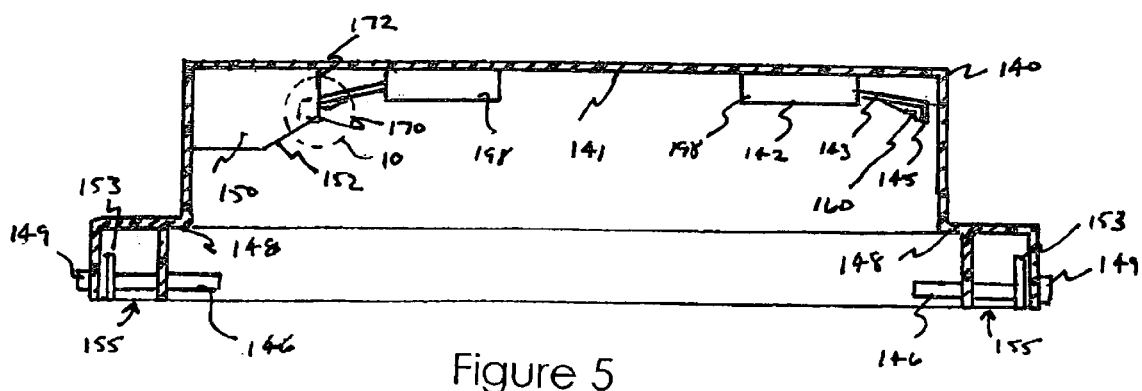
FIG. 5 is a sectional view of the cover portion of FIG. 4.

Cover portion 140, shown best in FIGS. 4 and 5, has reticle restraints 142 spaced apart on inner surface 141. Each reticle restraint 142 has a pair of resilient arms 143 which may be arranged in a right angle projecting from mounting ring 198. As shown best in FIG. 10, at the end of each resilient arm 143 is reticle engagement portion 145, which has notch 160 for engaging an upper corner of a reticle, as will be further described hereinbelow. Each mounting ring 198 is frictionally secured on a boss 190 projecting from inner surface 141. Tab 192 is provided to rotationally secure each reticle restraint 142. The position of reticle restraints 142 on inner surface 141 and the length of resilient arms 143 may be concertedly selected so that each reticle engagement portion 145 engages and restrains an upper corner of a reticle 200 positioned on reticle supports 122. In addition, the geometry and location of reticle restraints 142 may be selected so that each reticle restraint is slightly deflected and thereby exerts a downwardly directed bias on reticle 200 when cover portion 140 is completely engaged with base portion 120. Latch portions 144 are provided at opposite sides of cover portion 140 to securely fasten cover portion 140 to base portion 120. Each latch portion 144 has a pair of inwardly projecting latch tabs 146 connected by resilient connector portion 153. Each latch tab 146 has a gripping portion 149, allowing the latch tab to be grasped and pulled outwardly, so that each latch tab may clear edge 119 of base portion 120 during installation of cover portion 140 on base portion 120. Latch tabs 146 are received by latch recesses 130 in base portion 120. Each latch portion 144 is disposed in a recess 155 in cover portion 140. Recess cover 156 is provided to retain latch portion 144 within recess 155.

The unique self-positioning feature of the present invention is provided in a currently most preferred embodiment by a pair of positioning tabs 150, which project inwardly from inner surface 141 of cover portion 140, as shown best in FIGS. 4 and 5. Each positioning tab 150 has a diagonally oriented edge portion 152, which is disposed so as to engage the upper corner 210 of a reticle resting on reticle supports 122, when cover portion 140 is engaged with base portion 120. Each diagonally oriented edge portion 152 meets a vertically oriented edge portion 172 at corner 170.

Figure 6:
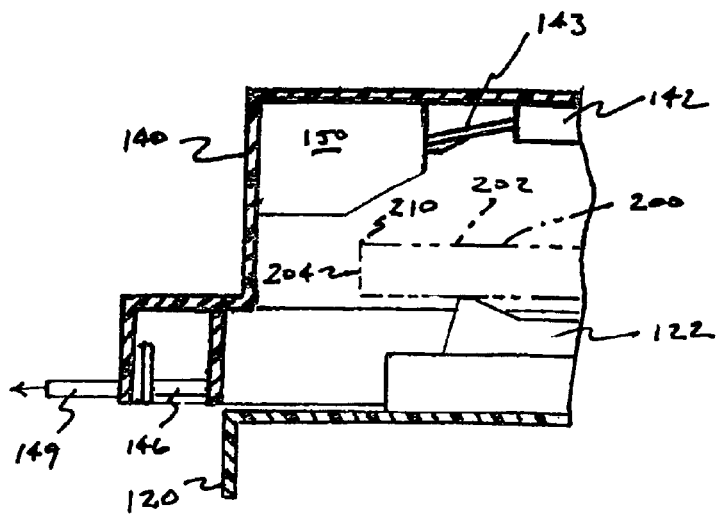
FIG. 6 is a partial sectional view showing the operation of the positioning tabs of a preferred embodiment of the present invention.
Figure 7:
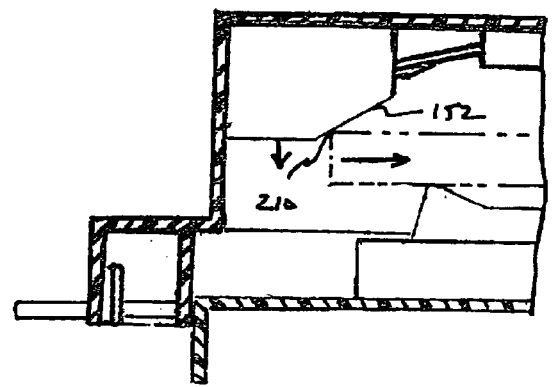
FIG. 7 is another partial sectional view showing the operation of the positioning tabs of a preferred embodiment of the present invention.
Figure 8:
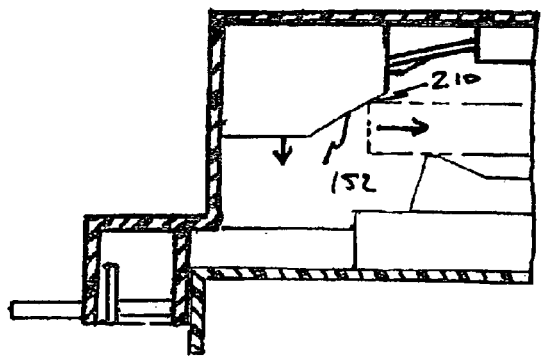
FIG. 8 is yet another partial sectional view showing the operation of the positioning tabs of a preferred embodiment of the present invention.
Figure 9:
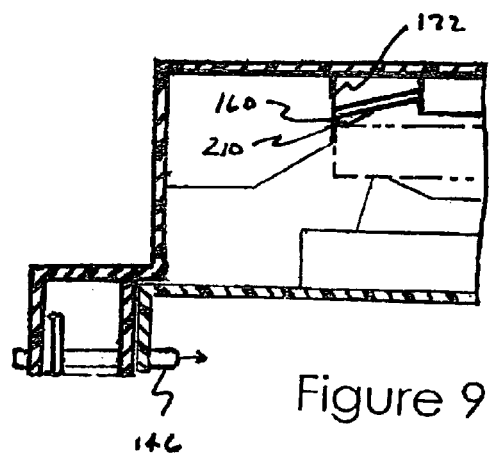
FIG. 9 is still another partial sectional view showing the operation of the positioning tabs of a preferred embodiment of the present invention.
Figure 10:
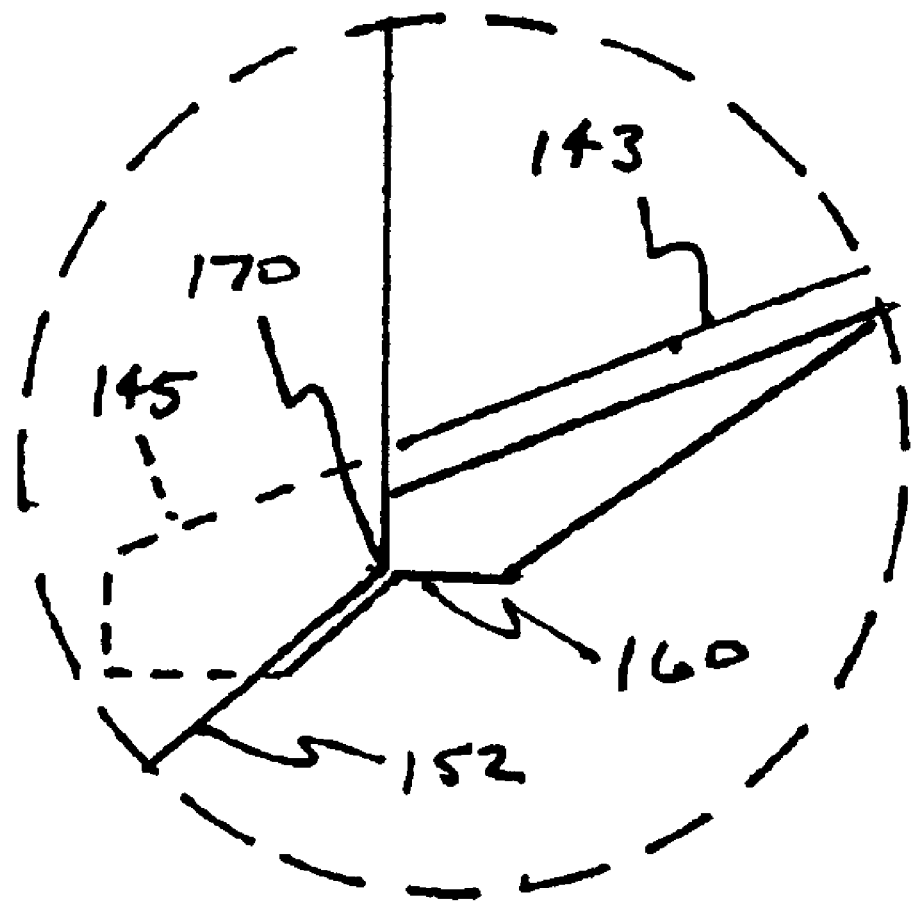
FIG. 10 is an enlarged view of a positioning tab and reticle restraint according to the present invention.

The operation of the invention may now be understood with reference to FIGS. 2–9. Reticle 200 may be manually positioned on reticle supports 122. Side positioning tabs 126 guide the lateral placement of reticle 200 so that each corner 212 formed by upper reticle surface 202 and side reticle surfaces 206 will be engaged by notches 160 in resilient arms 143 when cover portion 140 is fully engaged with base portion 120. Reticle 200 is preferably placed with back surface 208 in contact with back positioning tabs 128, but may be placed so that back surface 208 is spaced apart from back positioning tabs 128. Latch tabs 146 are then pulled outwardly, and cover portion 140 is placed over base portion 120 as shown in FIG. 6. As cover portion 140 is moved downward as shown in FIG. 7, if back surface 208 is spaced apart from back positioning tabs 128, the diagonal leading edges 152 of self-positioning tabs 150 engage corner 210, which is formed by upper reticle surface 202 and front reticle surface 204. Corner 210 slides along diagonal leading edge 152 as cover portion 140 is moved downward as shown in FIGS. 7 and 8, causing reticle 200 to be urged toward back positioning tabs 128. When cover portion 140 is nearly fully engaged with base portion 120, corner 210 slides past corner 170 so that vertically oriented edge portion 172 is engaged with front surface 204 as shown in FIG. 9. When in this position, the reticle 200 is properly positioned so that corners 210 and 214 will be engaged by notches 160 in the resilient arms 143 corresponding to the front and back sides of the reticle 200, respectively. Cover portion 140 may then be fully engaged with base portion 120, placing mating surface 148 in contact with gasket 123. Latch tabs 146 may then be allowed to move inwardly, engaging latch recesses 130, thus sealingly securing cover portion 140 to base portion 120.

Of course, many alternative embodiments of the present self-positioning reticle carrier are possible and are within the scope of the invention, as will be appreciated by those of skill in the art. Such embodiments would include, but are not limited to, varying numbers and locations and configurations of positioning tabs.

Although the description above contains many specificities, these should not be construed as limiting the scope of the invention but as merely providing illustrations of some of the presently preferred embodiments of the invention. Thus, the scope of the invention should be determined by the appended claims and their legal equivalents, rather than by the examples given.

What is claimed is:

1. A carrier for a reticle used in photolithographic semiconductor processing, the reticle being generally planar and having opposing upper and lower surfaces, the carrier comprising:

a base portion having at least a pair of spaced apart reticle supports, the reticle supports being positioned and adapted to contact and support the lower surface of the reticle when the reticle is rested thereon; and a cover portion adapted to sealingly mate with said base portion, said cover portion having an inner surface with a plurality of spaced apart reticle restraints and a pair of reticle positioning tabs projecting therefrom, each said reticle positioning tab having a diagonal edge portion oriented so as to laterally slidingly urge the reticle into engagement with said reticle restraints when said cover portion is mated with said base portion.

2. The reticle carrier of claim 1, wherein each of said reticle restraints comprises a pair of resilient arms arranged in a right angle, each resilient arm having a reticle engagement portion adapted to engage an upper edge of the reticle.

3. The reticle carrier of claim 1, further comprising at least one latching mechanism for securing said cover portion to said base portion.

4. The reticle carrier of claim 1, wherein each said reticle support comprises a rib projecting upwardly from the base.

5. The reticle carrier of claim 4, wherein the rib presents an upper edge with a pair of spaced apart reticle engagement portions.

6. A carrier for a generally planar reticle used in photolithographic semiconductor processing, comprising:

a base portion having a plurality of reticle supports adapted to contact and support a lower surface of the reticle when the reticle is rested thereon:

a cover portion adapted to sealingly mate with said base portion, said cover portion having a plurality of reticle restraints and at least one reticle positioning portion, said reticle positioning portion adapted to laterally slidingly urge the reticle into engagement with said reticle restraints when said cover portion is mated with said base portion.

7. The reticle carrier of claim 6, wherein said cover portion has an inner surface and said at least one reticle positioning portion comprises a tab projecting from said inner surface, said tab having a diagonal edge portion oriented so as to engage an upper edge of a reticle resting on said reticle supports when said cover portion is mated with said base portion.

8. The reticle carrier of claim 6, wherein each of said reticle restraints comprises a pair of resilient arms arranged in a right angle, each resilient arm having a reticle engagement portion adapted to engage an upper edge of the reticle.

9. The reticle carrier of claim 6, further comprising at least one latching mechanism for securing said cover portion to said base portion.

10. The reticle carrier of claim 6, wherein each said reticle support comprises a rib projecting upwardly from the base.

11. The reticle carrier of claim 10, wherein the rib presents an upper edge with a pair of spaced apart reticle engagement portions.

12. A carrier for a generally planar reticle comprising:

a base portion having a plurality of reticle supports adapted to contact and support a lower surface of the reticle when the reticle is rested thereon;

a cover portion adapted to sealingly mate with said base portion, said cover portion having a plurality of reticle restraints and means for laterally slidingly positioning the reticle into engagement with said reticle restraints when said cover portion is mated with said base portion.

13. The carrier of claim 12, wherein said means for positioning a reticle comprises a pair of tabs projecting from said inner surface, each said tab having a diagonal edge portion oriented so as to engage an upper edge of a reticle resting on said reticle supports when said cover portion is mated with said base portion.

14. The reticle carrier of claim 12, wherein said cover portion has an inner surface, wherein said means for positioning a reticle comprises a resilient member having a pair of opposing ends, one end being fixedly attached to said inner surface, the opposite end being free, and wherein said base portion has a pocket adapted to receive the free end of said resilient member.

15. The reticle carrier of claim 12, wherein each of said reticle restraints comprises a pair of resilient arms arranged in a right angle, each resilient arm having a reticle engagement portion adapted to engage an upper edge of the reticle.

16. The reticle carrier of claim 15, further comprising at least one latching mechanism for securing said cover portion to said base portion.

17. The reticle carrier of claim 12, wherein each said reticle support comprises a rib projecting upwardly from the base.

18. The reticle carrier of claim 17, wherein the rib presents an upper edge with a pair of spaced apart reticle engagement portions.

* * * * *